(12) United States Patent
Ding et al.

(10) Patent No.: US 10,018,697 B2
(45) Date of Patent: *Jul. 10, 2018

(54) METHOD FOR ESTIMATING A GRAPPA RECONSTRUCTION KERNEL

(71) Applicant: Ohio State Innovation Foundation, Columbus, OH (US)

(72) Inventors: Yu Ding, Columbus, OH (US); Orlando Simonetti, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 362 days.

This patent is subject to a terminal disclaimer.

(21) Appl. No.: 14/816,319

(22) Filed: Aug. 3, 2015

(65) Prior Publication Data

US 2015/0338487 A1  Nov. 26, 2015

Related U.S. Application Data

(63) Continuation of application No. 13/804,147, filed on Mar. 14, 2013, now Pat. No. 9,153,060.

(60) Provisional application No. 61/635,400, filed on Apr. 19, 2012.

(51) Int. Cl.
| | |
|---|---|
| *G01R 33/48* | (2006.01) |
| *G01R 33/56* | (2006.01) |
| *G06T 15/00* | (2011.01) |
| *G01R 33/561* | (2006.01) |
| *G01R 33/563* | (2006.01) |

(52) U.S. Cl.
CPC ..... *G01R 33/5608* (2013.01); *G01R 33/4818* (2013.01); *G01R 33/5611* (2013.01); *G06T 15/00* (2013.01); *G01R 33/56308* (2013.01)

(58) Field of Classification Search
CPC ............ G01R 33/4818; G01R 33/5608; G01R 33/5611; G06T 15/00
See application file for complete search history.

(56) References Cited

U.S. PATENT DOCUMENTS

| | | | |
|---|---|---|---|
| 2011/0044524 | A1 | 2/2011 | Wang et al. |
| 2013/0088225 | A1 | 4/2013 | Weller et al. |

OTHER PUBLICATIONS

Sodickson, D.K., "Tailored SMASH Image Reconstructions for Robust In Vivo Parallel MR Imaging," Magnetic Resonance in Medicine, vol. 44, No. 2, 2000, pp. 243-251.

Yeh, E.N., et al., "3Parallel Magnetic Resonance Imaging with Adaptive Radius in k-Space (PARS): Constrained Image Reconstruction Using k-Space Locality in Radiofrequency Coil Encoded Data," Magnetic Resonance in Medicine, vol. 53, No. 6, 2005, pp. 1383-1392.

*Primary Examiner* — Siamak Harandi
(74) *Attorney, Agent, or Firm* — Meunier Carlin & Curfman LLC

(57) ABSTRACT

A method for improving the signal-to-noise ratio (SNR) of TGRAPPA. The SNR of the ACS lines is proportional to the condition number of the GRAPPA kernel encoding equations. Therefore, the GRAPPA kernel estimated from higher SNR ACS lines amplifies the random noise in GRAPPA reconstruction. In TGRAPPA reconstruction of dynamic image series, a widely used method to acquire ACS lines is to average-all-frame (AAF). The present disclosure utilizes a tile-all-frame (TAF) as ACS lines to improve the SNR of the reconstructed images.

14 Claims, 6 Drawing Sheets

METHOD FOR ESTIMATING A GRAPPA RECONSTRUCTION KERNEL

CROSS-REFERENCE TO RELATED APPLICATION

This application is a continuation of U.S. patent application Ser. No. 13/804,147, filed Mar. 14, 2013, entitled "METHOD FOR ESTIMATING A GRAPPA RECONSTRUCTION KERNEL" This application also claims priority to U.S. Provisional Patent Application No. 61/635,400, filed Apr. 19, 2012, entitled "A NEW METHOD TO ESTIMATE THE GRAPPA RECONSTRUCTION KERNEL." The respective disclosures of the aforementioned applications are each incorporated herein by reference in its entirety.

BACKGROUND

Parallel Magnetic Resonance Imaging (pMRI) reconstruction techniques, e.g. SENSE and Generalized Autocalibrating Partially Parallel Acquisitions (GRAPPA), reduce scan time by under-sampling k-space, which directly improves temporal resolution in real-time cine imaging. GRAPPA, a k-space based pMRI technique, is widely used clinically for dynamic Magnetic Resonance (MR) imaging because of its robustness. GRAPPA reconstructs the missing k-space in each channel by applying convolution kernels on the acquired k-space. GRAPPA convolution kernels are estimated from fully-sampled k-space auto-calibration signal (ACS) lines using linear regression.

There are two widely-used methods to acquire ACS lines for GRAPPA reconstruction. The first method is to use a fully-sampled center of k-space block as the ACS lines in each frame; the second method is to use a separately acquired full-sampled k-space as the ASC lines. Each has limitations, for example, the first method lowers the efficiency and the second method is prone to motion artifacts.

In dynamic imaging, a variant of GRAPPA technique, the TGRAPPA method is commonly used. Multiple frame, uniformly down-sampled, temporally interleaved k-spaces are acquired, and the ACS lines are estimated using the temporal low-pass filtered images. In practice, an average-all-frame (AAF) method, i.e., the most extreme low-pass filtered image, is utilized as ACS lines of TGRAPPA.

Intuitively, ACS lines with a higher signal-to-noise ratio (SNR) should boost the accuracy of the kernel estimation and increase the SNR of GRAPPA reconstruction. Paradoxically, Sodickson et al. have found that higher SNR ACS lines used in GRAPPA may lead to lower SNR in the reconstructed images (Sodickson D K. Magn Reson Med 2000; 44(2):243-251; Yeh E N, et. al. Magn Reson Med 2005; 53(6):1383-1392). The reason is that the higher SNR in the ACS lines causes higher condition number of the GRAPPA kernel encoding equation. If the condition number is too high, the GRAPPA kernel encoding equations become ill-conditioned, and then the estimated GRAPPA kernel is corrupted by high random noise. Therefore, the corresponding GRAPPA reconstruction has lower SNR.

SUMMARY

Systems and methods for improving the signal-to-noise ratio (SNR) of TGRAPPA. The SNR of the autocalibration signal (ACS) lines is proportional to the condition number of the GRAPPA kernel encoding equations. Therefore, the GRAPPA kernel estimated from higher SNR ACS lines amplifies the random noise in GRAPPA reconstruction. In TGRAPPA reconstruction of dynamic image series, a widely used method to acquire ACS lines is to average-all-frame (AAF). The present disclosure implements a method of tile-all-frame (TAF) to acquire ACS lines to improve the SNR of the reconstructed images.

In accordance with some implementations, there is provided a method of determining a k-space convolution kernel in GRAPPA reconstruction of magnetic resonance imaging. The method may include acquiring plural frames of 2-D images or 3-D images at a same slice location (2-D) or slab location (3-D); acquiring k-space data of the plural frames of 2-D images or 3-D images; providing at least two sets of ACS lines from the acquired k-space data; and utilizing a number of linear equations estimate the k-space convolution kernel that is greater than a number of linear equations that could be derived from one set of ACS lines.

In accordance with some implementations, there is provided a method of determining a k-space convolution kernel in a k-space based reconstruction method that has at least one implicit k-space convolution kernel estimation step. The method may include acquiring k-space data of plural frames of images at a same location; providing at least two sets of ACS lines from the acquired k-space data; and utilizing a number of linear equations estimate the k-space convolution kernel that is greater than a number of linear equations that could be derived from one set of ACS lines.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
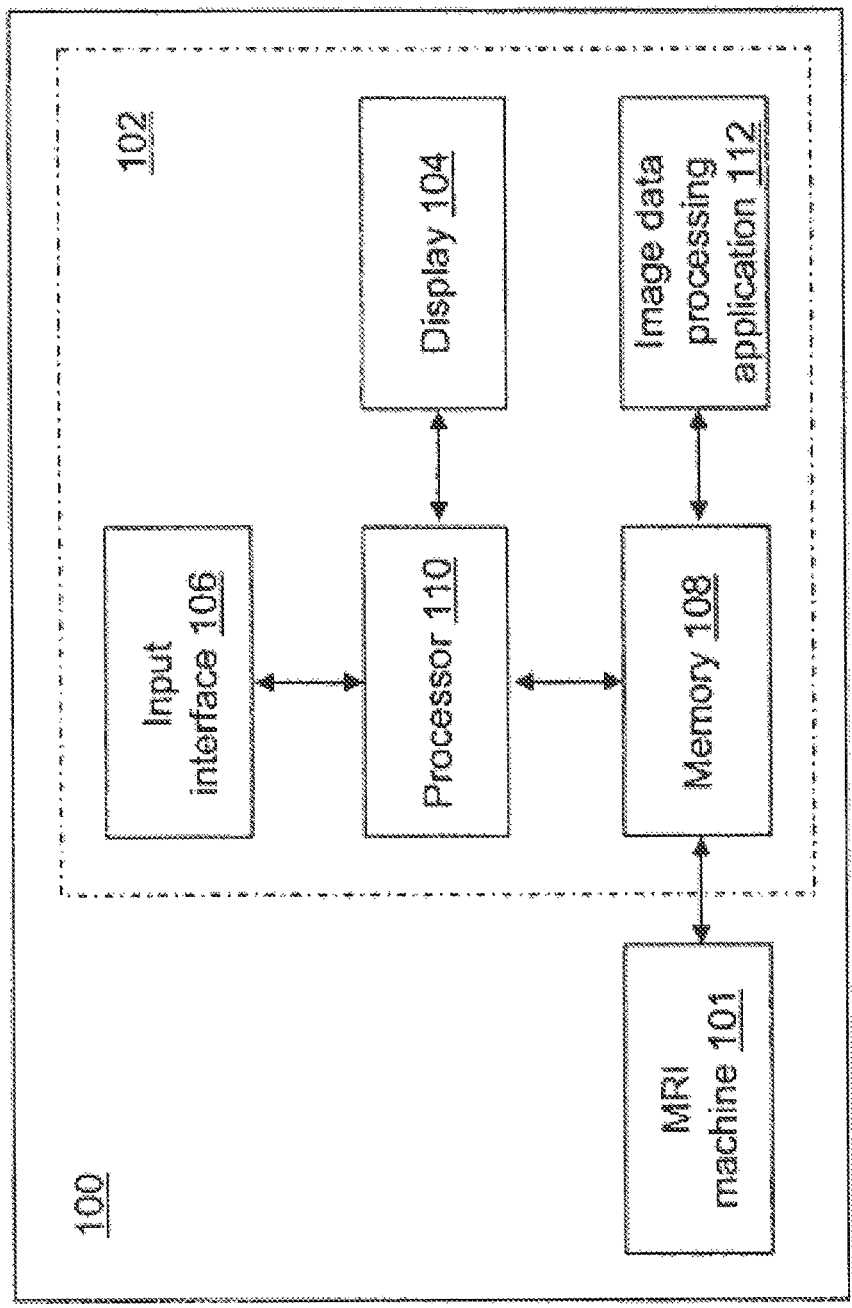
FIG. 1 illustrates a block diagram of an example MRI data processing system.

The present disclosure provides example implementations for improving the signal-to-noise ratio (SNR) of TGRAPPA by utilizing a tile-all-frame (TAF) as ACS lines to improve the SNR of the reconstructed images. With reference to FIG. 1, there is illustrated a block diagram of an MRI data processing system 100 is shown in accordance with an exemplary implementation. MRI data processing system 100 may include a magnetic resonance imaging (MRI)

apparatus 101 and a computing device 102. Computing device 102 may include a display 104, an input interface 106, a memory 108, a processor 110, and an image data processing application 112. In the embodiment illustrated in FIG. 1, MRI machine 101 generates MRI image data.

Computing device 102 may be a computer of any form factor. Different and additional components may be incorporated into computing device 102. Components of MRI data processing system 100 may be positioned in a single location, a single facility, and/or may be remote from one another. As a result, computing device 102 may also include a communication interface, which provides an interface for receiving and transmitting data between devices using various protocols, transmission technologies, and media as known to those skilled in the art. The communication interface may support communication using various transmission media that may be wired or wireless.

Display 104 presents information to a user of computing device 102 as known to those skilled in the art. For example, display 104 may be a thin film transistor display, a light emitting diode display, a liquid crystal display, or any of a variety of different displays known to those skilled in the art now or in the future.

Input interface 106 provides an interface for receiving information from the user for entry into computing device 102 as known to those skilled in the art. Input interface 106 may use various input technologies including, but not limited to, a keyboard, a pen and touch screen, a mouse, a track ball, a touch screen, a keypad, one or more buttons, etc. to allow the user to enter information into computing device 102 or to make selections presented in a user interface displayed on display 104. Input interface 106 may provide both an input and an output interface. For example, a touch screen both allows user input and presents output to the user.

Memory 108 is an electronic holding place or storage for information so that the information can be accessed by processor 110 as known to those skilled in the art. Computing device 102 may have one or more memories that use the same or a different memory technology. Memory technologies include, but are not limited to, any type of RAM, any type of ROM, any type of flash memory, etc. Computing device 102 also may have one or more drives that support the loading of a memory media such as a compact disk or digital video disk.

Processor 110 executes instructions as known to those skilled in the art. The instructions may be carried out by a special purpose computer, logic circuits, or hardware circuits. Thus, processor 110 may be implemented in hardware, firmware, software, or any combination of these methods. The term "execution" is the process of running an application or the carrying out of the operation called for by an instruction. The instructions may be written using one or more programming language, scripting language, assembly language, etc. Processor 110 executes an instruction, meaning that it performs the operations called for by that instruction. Processor 110 operably couples with display 104, with input interface 106, with memory 108, and with the communication interface to receive, to send, and to process information. Processor 110 may retrieve a set of instructions from a permanent memory device and copy the instructions in an executable form to a temporary memory device that is generally some form of RAM. Computing device 102 may include a plurality of processors that use the same or a different processing technology.

Image data processing application 112 performs operations associated with performing parallel image reconstruction of undersampled image data in k-space. Some or all of the operations subsequently described may be embodied in image data processing application 112. The operations may be implemented using hardware, firmware, software, or any combination of these methods. With reference to the exemplary embodiment of FIG. 1, image data processing application 112 is implemented in software stored in memory 108 and accessible by processor 110 for execution of the instructions that embody the operations of image data processing application 112. Image data processing application 112 may be written using one or more programming languages, assembly languages, scripting languages, etc.

MRI machine 101 and computing device 102 may be integrated into a single system such as an MRI machine. MRI machine 101 and computing device 102 may be connected directly. For example, MRI machine 101 may connect to computing device 102 using a cable for transmitting information between MRI machine 101 and computing device 102. MRI machine 101 may connect to computing device 102 using a network. MRI images may be stored electronically and accessed using computing device 102. MRI machine 101 and computing device 102 may not be connected. Instead, the MRI data acquired using MRI machine 101 may be manually provided to computing device 102. For example, the MRI data may be stored on electronic media such as a CD or a DVD. After receiving the MRI data, computing device 102 may initiate processing of the set of images that comprise an MRI study.

Background/Theory

Below is an introduction to estimating the GRAPPA kernel from k-space ACS lines. The sliding window average and tile-all-frame (SWTAF) as ACS lines to improve the SNR of the reconstructed images of the present disclosure will then be introduced. The SWTAF method of the present disclosure may be implemented in the environment of FIG. 1

The GRAPPA kernel can be estimated using fully-sampled k-space ACS lines, and the equation is linear regression:

$$AG=b \quad [1]$$

where m×n matrix A is the input of GRAPPA reconstruction. Each row of matrix A represents a GRAPPA sliding window in k-space, which has the same number of elements as the GRAPPA kernel size, e.g. for 12-channel coil, 4 by 5 kernel, the GRAPPA kernel size is 240, i.e. n=240. m is the number of reconstructed k-space points/sliding window, which is always equal or smaller than the total number of k-space points in ACS lines. Both G and b are 1-D vectors: G is the vectorized GRAPPA kernel with size n×1, and b is the vectorized output of GRAPPA reconstruction with size m×1. Usually, m>>n to make sure that Equation [1] is over-determined, i.e. the column of matrix A is always larger than the row of matrix A. When the GRAPPA acceleration rate is R, R−1 kernels are needed to perform reconstruction.

Equation [1] can be solved by direct inverting matrix A. The singular value decomposition (SVD) method and the Moore-Penrose pseudoinverse method are two widely used methods:

$$G=V(\Sigma^T)^{-1}U^H b \quad [2.a]$$

$$G=(A^H A)^{-1}A^H b \quad [2.b]$$

Equation [2.a] is computaionally more demanding, but the accuracy is better comparing to Equation [2.b]. According to SVD, $A=U\Sigma V^H$, where matrices V and U are unitary matrices, and $\Sigma$ is an diagonal matrix with the nonnegative singular values on the diagonal, and $\Sigma^T$ is the transpose of matrix $\Sigma$. The condition number of matrix A, $\kappa(A)$, is defined as $\kappa(A)=\sigma(A)_{max}/\sigma(A)_{min}$ where $\sigma(A)_{max}$ and $\sigma(A)_{min}$ are the largest and smallest eigenvalues of matrix A. Usually, the condition number of Equation [1] is high (>10), especially when large size kernel or more channels are used. Therefore, both solutions in Equation [2] are usually ill-conditioned.

The most commonly used regularization method of ill-conditioned linear system is the Tikhonov regularization. Two solutions in Equation [2] become:

$$G=V(\Sigma^T+\alpha I_{n\times m})^{-1}U^H b \quad [3.a]$$

$$G=(A^H A+\alpha^2 I_{n\times n})^{-1}A^H b \quad [3.b]$$

where parameter $\alpha$ is the regularization strength. Since all elements of matrix A are k-space points of ACS lines, then matrix A can be regard as a summation of a signal matrix $A_S$ and a noise matrix $A_N$, i.e. $A=A_S+A_N$. To further simplify the analysis, it is assumed that the noise in matrix $A_N$ is independent and identical (IID) noise with variance $\sigma_n^2$. Then Equation 2 becomes:

$$G=V(\Sigma_S^T+\sigma I_{n\times m})^{-1}U^H b \quad [3.a]$$

$$G=(A_S^H A_S+\sigma^2 I_{n\times n})^{-1}A^H b \quad [3.b]$$

If the matrix $A_S$ is low-rank, then the smallest singularvalue is zero, and the smallest singularvalue of the matrix A is dominated by the noise standard deviation. There are fine structures of the distribution of noise-only singularvalues.

The qualitative relation between the SNR of ACS lines and the condition number of the GRAPPA encoding equation can be explored using an experimental phantom study to test the following three hypothesis: (1) the largest/smallest singular value of the GRAPPA encoding matrix is proportional to the signal/noise of the ACS lines, and the condition number of the GRAPPA encoding matrix is proportional to the SNR of the ACS lines; (2) the largest/smallest singular value and the condition number of of the GRAPPA encoding matrix is insensitive of acceleration rate; (3) the RMSE of the GRAPPA reconstruction vs. SNR of ACS lines has a minimum at moderate SNR, i.e. the RMSE of the GRAPPA reconstruction vs. the SNR of ACS lines is a U-shaped function. Using a phantom study, it can be shown that the SNR of the TGRAPPA reconstruction using AAF ACS lines can be improved by an alternative ACS lines estimate that has lower SNR.

Implementation

As noted above, the TGRAPPA method is a widely used method to reconstruct dynamic MR images without acquiring separate ACS lines. An "average-all-frame" method is one of the strategies to generate the ACS lines in the TGRAPPA reconstruction method. Such a method is currently the only strategy available in commercial MRI scanners. As will be described hereinbelow, a "tile-all-frame" (TAF) method is presented as a new strategy to generate the autocalibration signal (ACS) lines of k-space based magnetic resonance imaging reconstruction method. The tile-all-frame method can replace the average-all-fame strategy used in the TGRAPPA reconstruction method.

Figure 2:
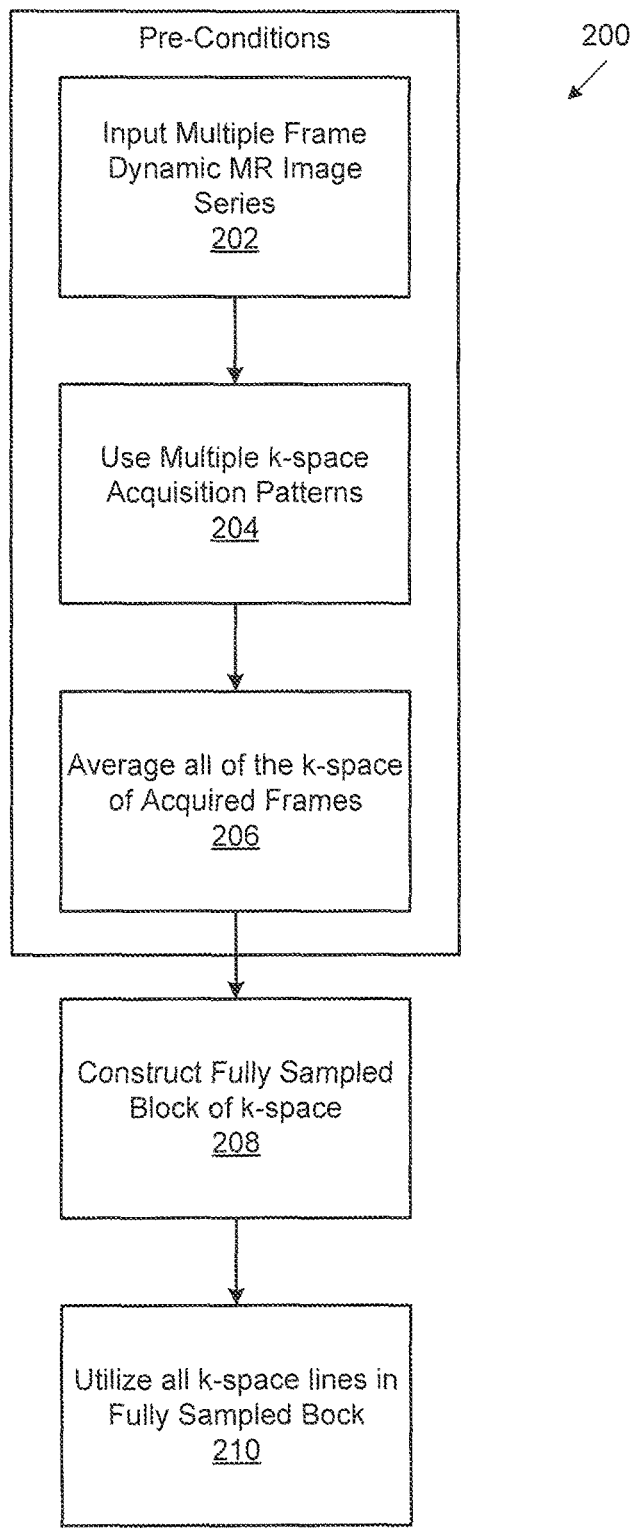
FIG. 2 illustrates an example operational flow for the computation of the GRAPPA reconstruction kernel.

FIG. 2 illustrates an example operational flow 200 of the tile-all-frame methodology. In the operational flow 200, the tile-all-frame method begins with certain pre-conditions. The input series to the operational flow consists of a multiple frame dynamic MR image series (202). Multiple k-space acquisition patterns are utilized in the dynamic image series (204). In particular, each acquisition pattern only acquires part of the k-space lines, i.e., only part of the k-space lines is sampled, and the rest of k-space lines are not sampled.

When all the k-space of acquired frames is averaged together, a block of k-space is fully sampled (206). The block of fully sampled k-space lines can be the full k-space. The block of fully-sampled k-space is the ACS lines used in the average-all-frame strategy.

The tile-all-frame strategy continues by constructing a multiple fully-sampled (block of) k-space from the original image series (210). For example, if 64 frames are acquired, half of the k-space lines for each frame are acquired, i.e., the acceleration rate is 2. In a widely used acquisition pattern, for all odd frames, only odd k-space lines are acquired. Similarly, for all even frames, only even k-space lines are acquired. Next, all adjacent two frames can be paired to create 32 image pairs. Each pair of frames is added to be one fully sampled k-space, and then 32 fully sampled k-space is constructed. Where the average-all-frame strategy averages all 32-frames to generate one full k-space, the ACS lines, the tile-all-frame strategy utilizes directly all k-space lines in 32 fully sampled k-space as ACS lines. The tile-all-frame strategy directly utilizes all k-space lines in all fully-sampled (block of) k-space as ACS lines (212).

The construction of multiple fully-sampled (block of) k-space from the original image series used in tile-all-frame strategy can be, but not limited to, temporal sliding window average. The above example utilizes the temporal sliding window average with sliding window width=2. Using the above k-space acquisition example, examples of other methods are: (1) average four frames to generate 16 fully-sampled k-space which are the ACS lines of tile-all-frames; (2) temporal low-pass filter the 64 down-sampled k-space, and then repeat (1).

In addition to the above, the signal-to-noise ratio (SNR) in the ACS lines affects the condition number of the linear equations to estimate the GRAPPA kernel. The relation between the ACS lines SNR and the condition number of the GRAPPA kernel estimation linear equations is linear. Linear equations with high conditional number are ill-conditioned, and the solution is not stable, i.e. there is an amplification effect of the random noise. The GRAPPA/TGRAPPA reconstructed images using the GRAPPA kernel estimated from linear equations with high conditional number has lower SNR. The ACS lines SNR of average-all-frame strategy is higher than tile-all-frame strategy.

Phantom Study

A phantom study were performed on a 1.5 T MR scanner (MAGNETOM Avanto, Siemens Healthcare, Germany) using an SSFP sequence. A Siemens standard 12-channel body matrix array coil and a 32-channel cardiac array coil (RapidMRI, Columbus, Ohio) were used for data acquisition in the phantom study. The GRAPPA reconstruction method was implemented and all images processed using Matlab® 2011a (MathWorks, Natick, Mass.) running on a personal computer with Intel® Core i7-960 3.2 GHz CPU, 24 GB system RAM.

Multiple image series were acquired with variant signal level by adjusting the flip angle in SSFP sequence. It has been shown that the signal of the SSFP sequence is proportional to the flip angle in a wide range. The noise level is determined by the bandwidth and the resistance in the circuit because the noise is dominated by Johnson noise, independent of all other parameters of the sequence. Therefore, the noise level is a constant in all acquired image series. The noise level may be varied by averaging frames.

Fourteen images series each with 86 frames were acquired with flip angles varying from 1° to 70°. All k-space was fully sampled. 18 sets of ACS lines with variant SNR were prepared. The first 14 sets of ACS lines were the first frame of the 14 image series, and the SNR was varied by changing flip angle. The last four sets of ACS lines were prepared by averaging 2, 4, 8, and 16 frames of the 70° flip angle cine, thus the SNR was varied by changing the noise level. The root-mean-square-error (RMSE) of GRAPPA reconstruction using kernels estimated from ACS lines with variant SNR was calculated.

The GRAPPA kernel size utilized in the phantom study varies from 2×3 to 6×11. Most of experimental results shown in this study utilized a 4×5 GRAPPA kernel, i.e., four k-space phase-encoding lines and five data points in each k-space line are included in the GRAPPA kernel. The GRAPPA kernel span in the k-space is also dependent on the acceleration rate, e.g. at acceleration rate=2, the 4×5 GRAPPA kernel spans nine phase encoding lines, whereas at acceleration rate=4, the 4×5 GRAPPA kernel spans 17 phase encoding lines.

Figure 3:
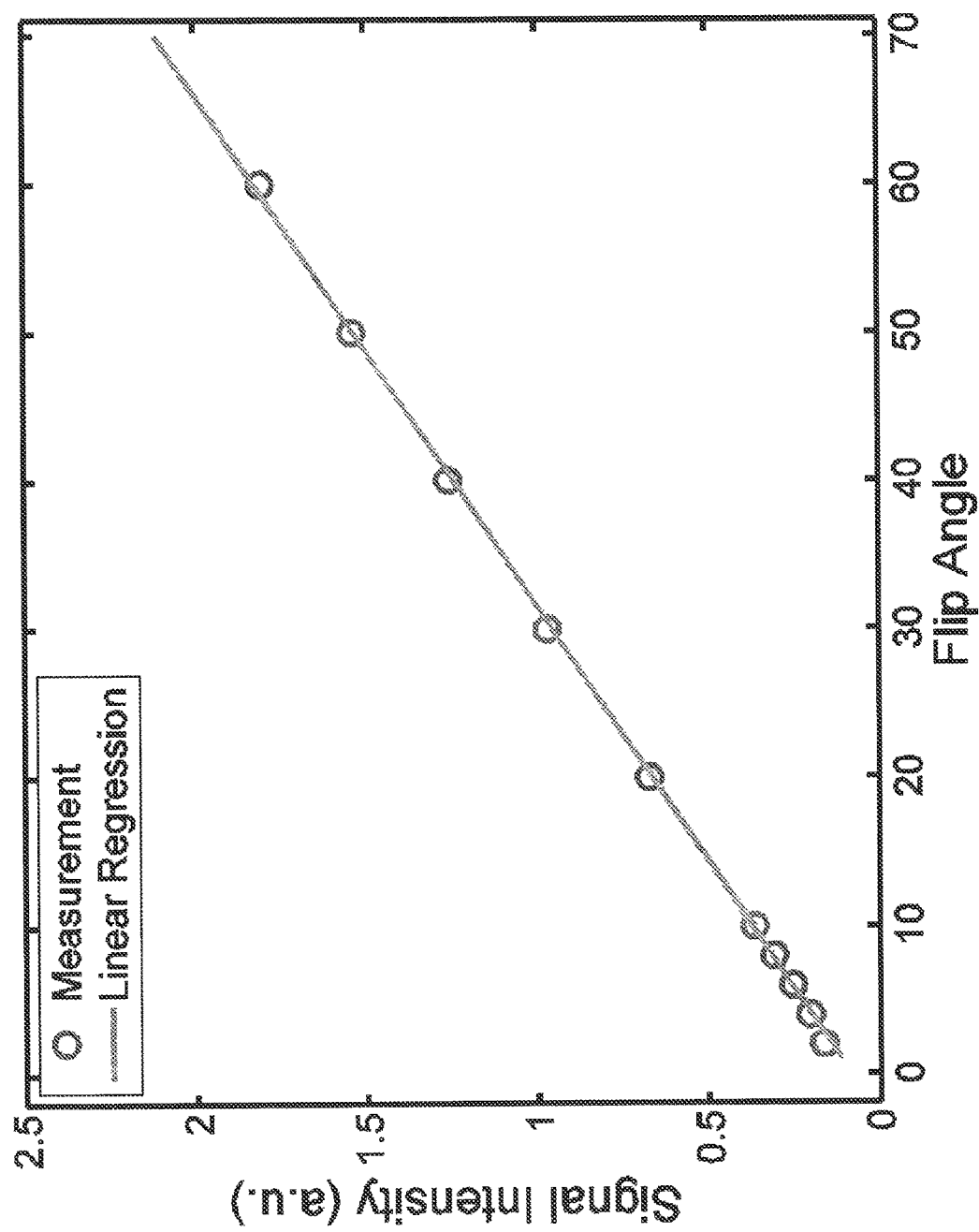
FIG. 3 illustrates the mean pixel intensity of the phantom vs. flip angle, where the images were acquired using a standard Steady-State Free Precession (SSFP) sequence.

FIG. 3 illustrates two estimates of ACS lines from the same raw data. The image SNR was measured using the MP-law method. A 4×5 GRAPPA kernel was used in images reconstruction.

Results

A. Phantom Study

FIG. 3 shows the mean pixel intensity of the phantom vs. flip angle. Since the flip angle are relatively low, the linear relation between the signal intensity and the flip angle is still valid.

Figure 4A:
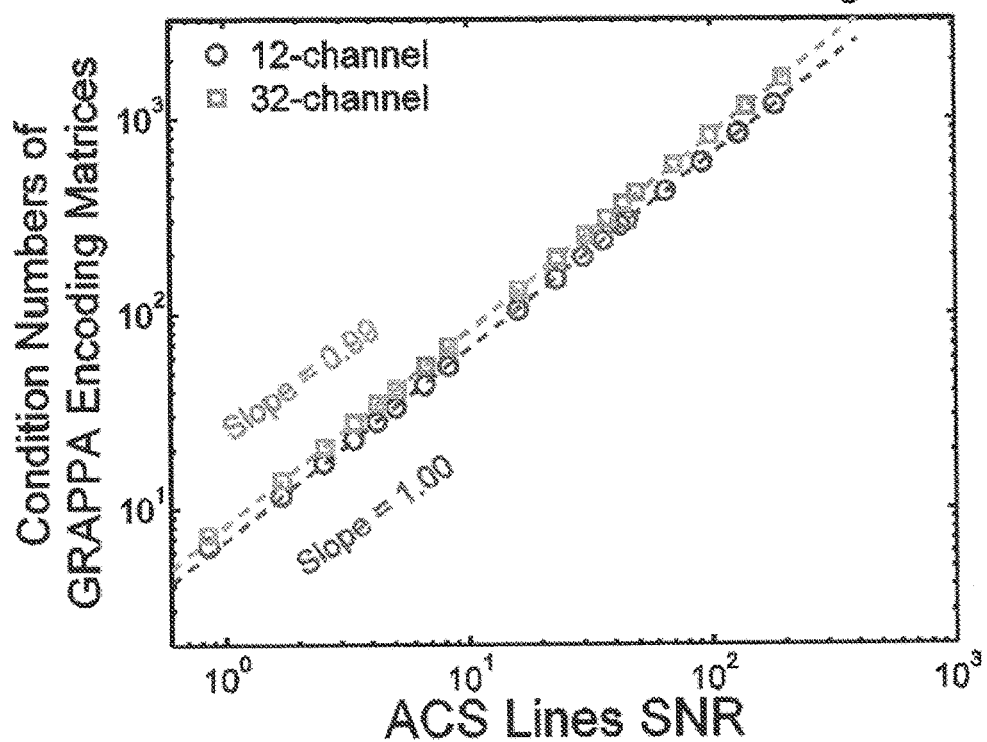
FIG. 4*a* illustrates that the condition number follows a linear relation with SNR over two orders of magnitude.
Figure 4B:
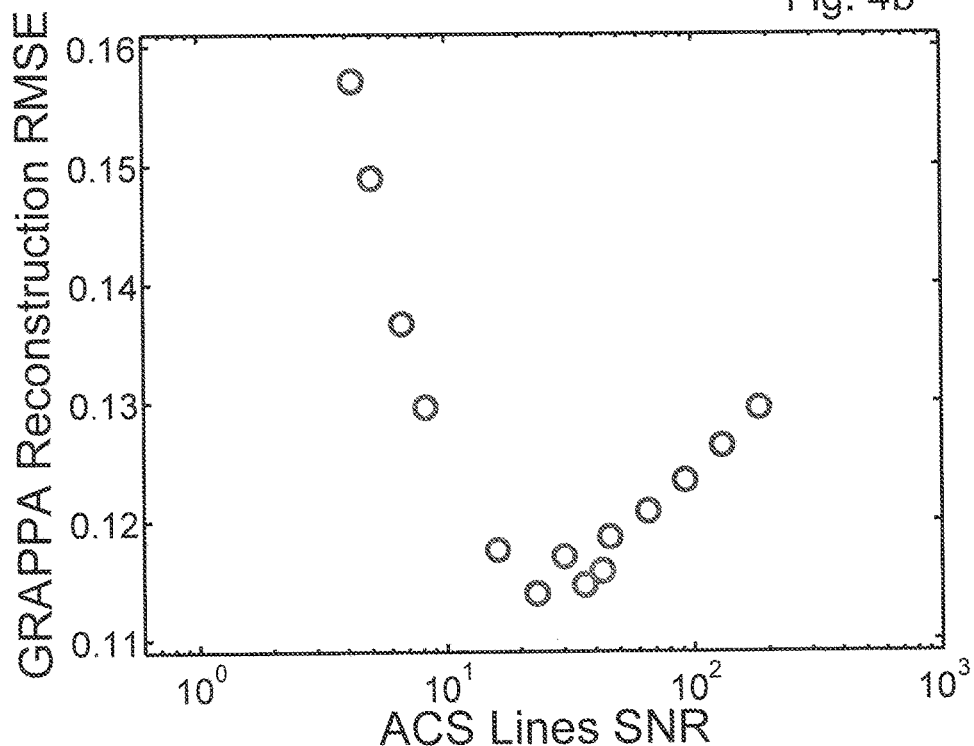
FIG. 4*b* illustrates that the Root Mean Square Error (RMSE) of GRAPPA reconstruction reaches the minimum when the ACS lines have moderate SNR.

FIG. 4a shows that the condition number follows a linear relation with SNR over two orders of magnitude. FIG. 4b demonstrates that the RMSE of GRAPPA reconstruction reaches the minimum when the ACS lines have moderate SNR. The "sweet spot" corresponds to ACS lines with flip angle=40°.

Figure 5:
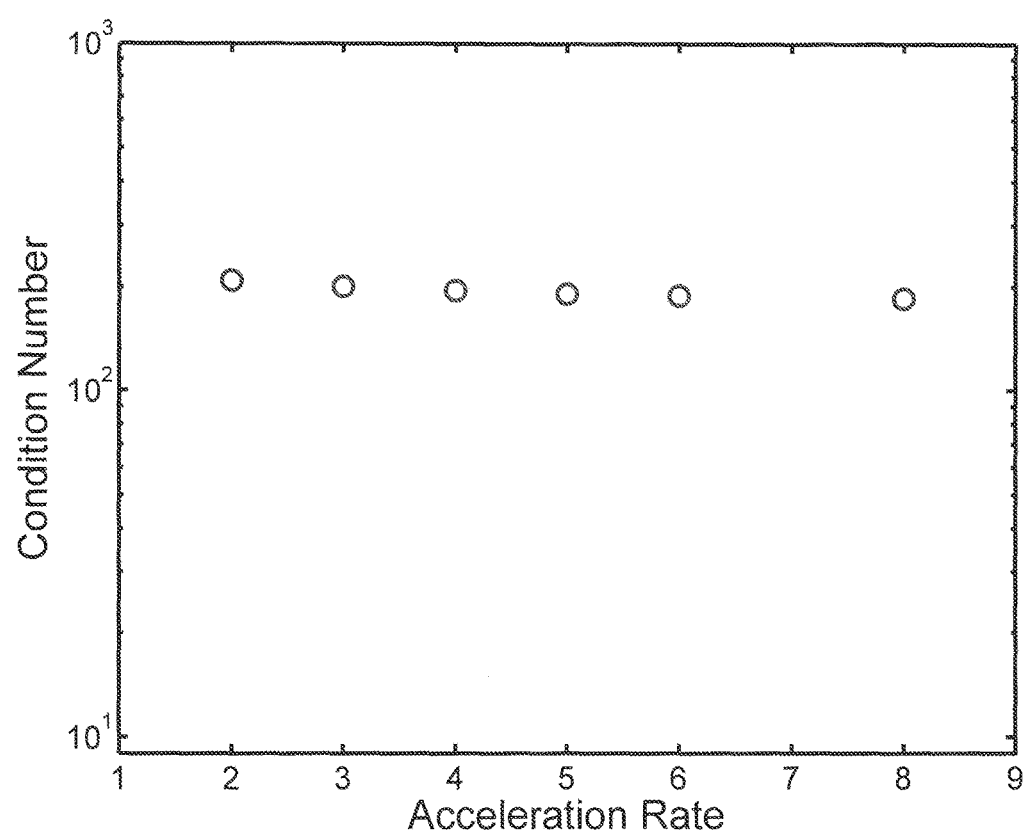
FIG. 5 illustrates the condition number of the encoding matrix vs. the acceleration rate.

FIG. 5 shows the condition number (ration of the largest and the smallest singular values of the encoding matrix) vs the acceleration rate. The condition number are not sensitive on the acceleration rate. The condition number of acceleration R=8 is 11% less than that of R=2. The kernel size is 2 by 3.

Figure 6:
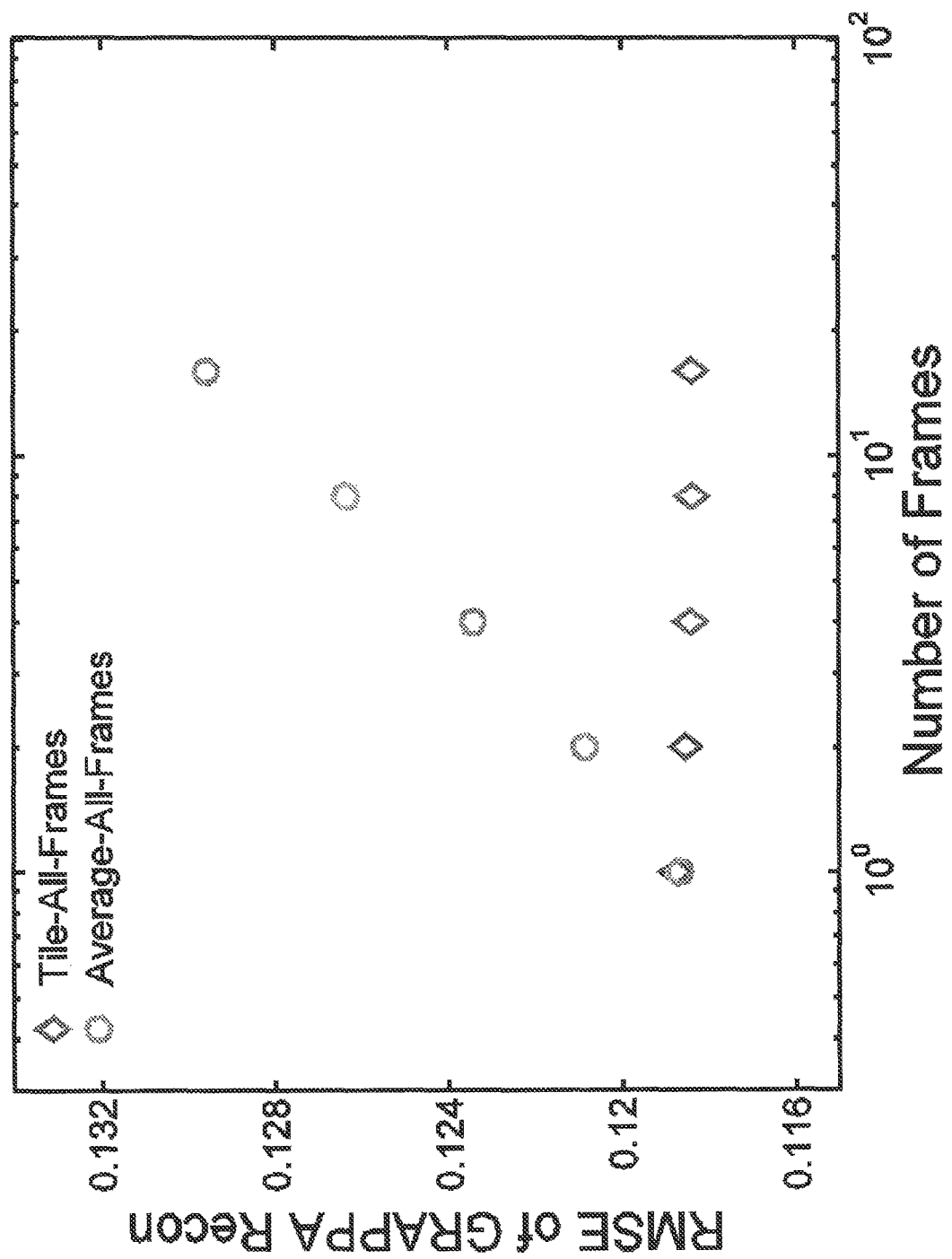
FIG. 6 illustrates that the RMSE of phantom images reconstructed from the AAF method and the TAF method vs. the number of frames included.

FIG. 6 shows the root-mean-square-error (RMSE) of images reconstructed from the AAF method, the TAF method in phantom study.

Discussion

In this study, a phantom experiment is performed to reveal a simple proportional relation between the SNR of ACS lines and the condition number of the GRAPPA kernel regression equation. In addition, the largest eigenvalue of the GRAPPA kernel encoding matrix is proportional to the signal level of the ACS lines, while the lowest eigenvalue is proportional to the noise level of the ACS lines. The above results are not sensitive to the acceleration rate or the kernel size. Counter intuitively, high SNR ACS lines may degrade the SNR of the GRAPPA reconstruction because of the high condition number in the kernel estimation. As shown in the phantom study, a slightly lower SNR ACS lines may lead to higher SNR in GRAPPA reconstruction.

From a quantitative study, which is in agreement with the observation of Sodickson et al, the noise in the ACS lines has the same effect as the Tikhonov regularization. Higher SNR in the ACS lines has similar effects as applying a lower Tikhonov regularization parameter in linear regression, and vice versa, i.e. the high SNR ACS lines may lead to under-regularization of the GRAPPA encoding matrix, and the low SNR ACS lines may lead to over-regularized GRAPPA encoding matrix. Therefore, the SNR of the ACS lines should be considered when choosing an optimal Tikhonov regularization parameter for GRAPPA kernel encoding matrix.

It is well-known that the Tikhonov regularization has a generic trade-off between image signal and noise. When high regularization strength is applied, the random noise is suppressed, but the image artifacts/blurring become more pronounced, and vice versa. Then higher SNR of the ACS lines may amplify random noise in GRAPPA reconstruction, but preserve the image sharpness; lower SNR of the ACS lines may boost image SNR but over-smooth the image/ increase artifacts level. In real-time cardiac cine images acquired using the TGRAPPA technique, the SNR of ACS lines estimated using AAF may be too high. The estimation of ACS lines using TAF is a better strategy in TGRAPPA reconstruction because it uses all k-space data as ACS lines without affecting the SNR. The in vivo experiment shows that this new approach improves TGRAPPA SNR in a clinically relevant imaging protocol.

The results show that lowering the condition number in the GRAPPA kernel estimate equation can lower the random noise in GRAPPA reconstruction. This effect has been observed and applied in the high-pass GRAPPA (hp-GRAPPA) method. The hp-GRAPPA method only utilizes the high-pass filtered k-space lines as ACS lines, and the SNR of the reconstructed image is higher. Obviously, the SNR of the ACS lines is lowered after high-pass filtering, so is the condition number of the GRAPPA kernel encoding matrix (because this is trivial to test, the result is not included in this study). Therefore, the random noise in the hp-GRAPPA reconstructed images is suppressed. The image quality of the hp-GRAPPA reconstruction can be better than GRAPPA reconstruction if the high-pass filter is properly chosen.

On the other hand, the "optimal" GRAPPA reconstruction may not be the lowest RMSE reconstruction because the human perception of noise and artifacts are different. Usually the observer can tolerate a relatively high level of random noise, but cannot tolerate a relative low level of artifacts. Then the "optimal" GRAPPA reconstruction may require a slightly higher SNR of ACS lines than the minimal RMSE indicates, i.e. trade some degree of random noise for lowering the artifacts level. However, there is still no well-established method other than RMSE to assess subtle image quality change. Then the results illustrated in FIG. 5 are rather qualitative than quantitative. How to find the "optimal" SNR of ACS lines for GRAPPA reconstruction is still an open question at this moment of time.

The analysis herein is based on an assumption that the signal matrix S is a low-rank matrix. In other words, the GRAPPA convolution kernel has more support that it requires, or the kernel shape is not optimal. Therefore, if the GRAPPA kernel size remains the same (the same number of un-known in the GRAPPA encoding equations), but the optimal kernel shape is used, the condition number can be lowered, and hence the image quality of reconstruction improves.

Thus, as described above, a simple proportional relation exists between the SNR of ACS lines and the condition number of the GRAPPA kernel regression equation. High SNR ACS lines should not be used to avoid the SNR degradation of the GRAPPA reconstruction. Higher SNR in the ACS lines has similar effects as applying a lower Tikhonov regularization parameter in linear regression, and vice versa. Adopting a set of ACS lines with slightly lower SNR improves the GRAPPA reconstruction in the clinical TGRAPPA set-up.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an API, reusable controls, or the like. Such programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

Although example embodiments may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described previously. Rather, the specific features and acts described previously are disclosed as example forms of implementing the claims.

What is claimed:

1. A method of determining a k-space convolution kernel in GRAPPA reconstruction of magnetic resonance imaging, comprising:
   acquiring a multiple frame dynamic Magnetic Resonance (MR) image series comprising 2-D images or 3-D images at a same slice location (2-D) or slab location (3-D);
   using multiple k-space data acquisition patterns, wherein each k-space data acquisition pattern acquires a subset of k-space lines;
   averaging each acquired k-space data acquisition pattern to generate a block of fully sampled k-space;
   providing at least two sets of auto-calibration signal (ACS) lines from the block of fully-sampled k-space; and
   estimating the k-space convolution kernel from the at least two sets ACS lines, whereby Generalized Auto-calibrating Partially Parallel Acquisitions (GRAPPA) or temporal GRAPPA (TGRAPPA) reconstruction of images is performed using the k-space convolution kernel.

2. The method of claim 1, further comprising applying a linear regression to the at least two sets of ACS lines to estimate the k-space convolution kernel.

3. The method of claim 2, wherein a well-posedness of the linear equations used to estimate the k-space convolution kernel are determined in accordance with a condition number.

4. The method of claim 3, wherein the condition number is affected by the signal-to-noise ratio in the ACS lines.

5. The method of claim 3, further comprising combining the linear equations with any type of regularization to estimate the k-space convolution kernel.

6. The method of claim 2, wherein the linear regression is defined by the relationship:

$$AG=b,$$

wherein an m×n matrix A is the input of the GRAPPA reconstruction or other k-space based reconstructions, wherein each row of the matrix A represents a sliding window in k-space, m is the number of reconstructed k-space points/sliding window, wherein G is a vectorized GRAPPA kernel with size n×1, and wherein b is a vectorized output of the GRAPPA reconstruction with size m×1.

7. The method of claim 1, further comprising determining multiple k-space convolution kernels.

8. A non-transitory computer readable medium containing computer-executable instruction that when executed by a processor of a computing device performs a method of determining a k-space convolution kernel in GRAPPA reconstruction of magnetic resonance imaging, comprising:
   acquiring a multiple frame dynamic Magnetic Resonance (MR) image series comprising 2-D images or 3-D images at a same slice location (2-D) or slab location (3-D);
   using multiple k-space data acquisition patterns, wherein each k-space data acquisition pattern acquires a subset of k-space lines;
   averaging each acquired k-space data acquisition pattern to generate a block of fully sampled k-space;
   providing at least two sets of auto-calibration signal (ACS) lines from the block of fully-sampled k-space; and
   estimating the k-space convolution kernel from the at least two sets ACS lines, whereby Generalized Auto-calibrating Partially Parallel Acquisitions (GRAPPA) or temporal GRAPPA (TGRAPPA) reconstruction of images is performed using the k-space convolution kernel.

9. The non-transitory computer readable medium of claim 8, further comprising instructions for applying a linear regression to the at least two sets of ACS lines to estimate the k-space convolution kernel.

10. The non-transitory computer readable medium of claim 9, wherein the linear equations used to estimate the k-space convolution kernel are determined in accordance with a condition number.

11. The non-transitory computer readable medium of claim 10, wherein the condition number is affected by a signal-to-noise ratio in the ACS lines.

12. The non-transitory computer readable medium of claim 10, further comprising instructions for combining the linear equations with any type of regularization to estimate the k-space convolution kernel.

13. The non-transitory computer readable medium of claim 9, wherein the linear regression is defined by the relationship:

$$AG=b,$$

wherein an m×n matrix A is the input of the GRAPPA reconstruction, wherein each row of the matrix A represents a GRAPPA sliding window in k-space, m is the number of reconstructed k-space points/sliding window, wherein G is a vectorized GRAPPA kernel with size n×1, and wherein b is a vectorized output of the GRAPPA reconstruction with size m×1.

14. The non-transitory computer readable medium of claim 13, wherein a number of equations m is larger than a number of equations constructed from the one set of ACS lines.

* * * * *

UNITED STATES PATENT AND TRADEMARK OFFICE
CERTIFICATE OF CORRECTION

PATENT NO. : 10,018,697 B2
APPLICATION NO. : 14/816319
DATED : July 10, 2018
INVENTOR(S) : Yu Ding et al.

It is certified that error appears in the above-identified patent and that said Letters Patent is hereby corrected as shown below:

Column 1, Line 18, insert:
--STATEMENT OF GOVERNMENT SUPPORT
This invention was made with government support under R01 HL102450 awarded by the National Institutes of Health. The government has certain rights in the invention.--

Signed and Sealed this
Thirtieth Day of October, 2018

Andrei Iancu
*Director of the United States Patent and Trademark Office*

UNITED STATES PATENT AND TRADEMARK OFFICE
CERTIFICATE OF CORRECTION

PATENT NO. : 10,018,697 B2  
APPLICATION NO. : 14/816319  
DATED : July 10, 2018  
INVENTOR(S) : Ding et al.

Page 1 of 1

It is certified that error appears in the above-identified patent and that said Letters Patent is hereby corrected as shown below:

In the Specification

Column 1, Line 17 should read Government Support Clause:  
--This invention was made with government support under grant number HL102450 awarded by the National Institutes of Health. The government has certain rights in the invention.--

This certificate supersedes the Certificate of Correction issued October 30, 2018.

Signed and Sealed this  
Sixth Day of October, 2020

Andrei Iancu  
*Director of the United States Patent and Trademark Office*